United States Patent
Kobayashi et al.

(10) Patent No.: US 6,455,342 B2
(45) Date of Patent: Sep. 24, 2002

(54) SEMICONDUCTOR DEVICE, ITS MANUFACTURING METHOD AND SUBSTRATE FOR MANUFACTURING A SEMICONDUCTOR DEVICE

(75) Inventors: Toshimasa Kobayashi; Tsuyoshi Tojo, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/840,199

(22) Filed: Apr. 23, 2001

Related U.S. Application Data

(62) Division of application No. 09/260,138, filed on Mar. 1, 1999.

(30) Foreign Application Priority Data

Mar. 6, 1998 (JP) .......................................... 10-055272

(51) Int. Cl.$^7$ ............................................... H01L 21/00
(52) U.S. Cl. .......................................... 438/33; 372/44
(58) Field of Search ....................... 438/29, 33; 372/44

(56) References Cited

U.S. PATENT DOCUMENTS

| | | | |
|---|---|---|---|
| 3,805,123 A | | 4/1974 | Rieger |
| 5,753,966 A | * | 5/1998 | Morita et al. ................ 257/627 |
| 5,814,532 A | * | 9/1998 | Ichihara ........................ 438/33 |
| 5,972,730 A | * | 10/1999 | Saito et al. .................... 438/39 |
| 6,185,238 B1 | * | 2/2001 | Onomura et al. ............. 372/46 |

* cited by examiner

Primary Examiner—Douglas A. Wille
(74) Attorney, Agent, or Firm—Sonnenschein, Nath & Rosenthal

(57) ABSTRACT

It is intended to provide a semiconductor device, its manufacturing method and substrate for manufacturing the semiconductor device which ensures that good cleavable surfaces be made stably in a semiconductor layer under precise control upon making edges of cleaves surfaces in the semiconductor layer stacked on a substrate even when the substrate is non-cleavable, difficult to cleave or different in cleavable orientation from the semiconductor layer. A semiconductor layer 2 made of III–V compound semiconductors is stacked to form a laser structure on a sapphire substrate 1. In selective locations other than the location of a ridge stripe portion 11 and a mesa portion 12 along a portion of a semiconductor layer 2 where a cavity edge 3 should be made, namely, in locations at opposite sides of the mesa portion 12, stripe-shaped cleavage-assist grooves 4 are made to extend in parallel to the (11–20)-oriented surface of the semiconductor layer 2, and the semiconductor layer 2 and the sapphire substrate 1 are cleaved from the cleavage-assist groove 4 to make the cavity edge 3 made up of the cleavable surface of the semiconductor layer 2.

27 Claims, 8 Drawing Sheets

SEMICONDUCTOR DEVICE, ITS MANUFACTURING METHOD AND SUBSTRATE FOR MANUFACTURING A SEMICONDUCTOR DEVICE

RELATED APPLICATION DATA

This patent is a divisional application of Ser. No. 09/260,138, filed on Mar. 1, 1999. This patent application claims priority to Japanese Application No. P10-055272, filed Mar. 6, 1998, which application is incorporated herein by reference to the extent permitted by law.

BACKGROUND OF THE INVENTION

1. Field of the Invention

This invention relates to a semiconductor device, its manufacturing method and a substrate for manufacturing a semiconductor device, and more particularly to a semiconductor device, like a semiconductor laser, having cavity edges made by cleavage, its manufacturing method, and a substrate, like a wafer, used for manufacturing such a semiconductor device.

2. Description of the Related Art

Nitride III–V compound semiconductors, such as GaN, AlGaN and GaInN, made of a group III element, such as gallium (Ga), aluminum (Al) and indium (In), and nitrogen as a group V element, are direct-transitional semiconductors, and they have larger band gaps than those of semiconductors such as AlGaInAs and AlGaInP used in currently available semiconductor lasers. Therefore, they are expected to be widely applicable as light sources of high-integrated, high-density optical disc reproducing apparatuses and optical elements for full-color display devices, in form of short-wavelength semiconductor lasers for emission wavelengths in the band of 400 nm, light emitting diodes (LED) and other semiconductor light emitting devices capable of emitting ultraviolet to green light. Moreover, these nitride III–V compound semiconductors exhibit large saturation electron velocities under a high electric field, and are remarked as materials of electron-mobility devices such as field-effect transistors (FET) for high powers and high frequencies.

Semiconductor lasers, light emitting diodes and FETs using these nitride III–V compound semiconductors are made by epitaxially growing nitride III–V compound semiconductors on a substrate such as sapphire ($Al_2O_3$) substrate, for example.

In semiconductor lasers, in general, cavity edges must be made. In AlGaInAs, AlGaInP or InP semiconductor lasers, substrates and semiconductor layers grown thereon are cleavable, and cleavable surfaces are normally used as cavity edges of the semiconductor lasers.

In case of nitride III–V compound semiconductors, however, it is usually difficult to make stable cleavable surfaces because their crystallographic structures are hexagonal system wurtzite structures. Moreover, since these semiconductor lasers using nitride III–V compound semiconductors are usually made by growing nitride III–V compound semiconductors on sapphire substrates which are not cleavable, it has been difficult to fabricate semiconductor lasers using cleavable surfaces as cavity edges.

Japanese Patent Laid-open Publications Nos. hei 8-222807 and hei 9-172223, for example, disclose methods for manufacturing GaN semiconductor lasers in which cavity edges are made by cleaving a sapphire substrate and III–V compound semiconductor layers stacked thereon.

More specifically, as shown in FIG. 1, these conventional methods for manufacturing GaN semiconductor lasers sequentially grow a GaN buffer layer 102, n-type GaN contact layer 103, n-type AlGaN cladding layer 104, active layer 105 of a GaN/GaInN multiquantum well structure, p-type AlGaN cladding layer 106 and p-type GaN contact layer 107 on a c-plane sapphire substrate 101 by metal organic chemical vapor deposition (MOCVD).

Next made on the p-type GaN contact layer 107 is a resist pattern (not shown) in form of a predetermined stripe. Using the resist pattern as a mask, reactive ion etching (RIE) is conducted to selectively remove upper layers including an upper part of the n-type GaN contact layer 103. As a result, the upper-lying part of the n-type GaN contact layer 103, n-type AlGaN cladding layer 104, active layer 105, p-type AlGaN cladding layer 106 and p-type GaN contact layer 107 are patterned into a predetermined mesa structure extending in a direction. Numeral 108 denotes the mesa portion.

After the resist pattern is removed, the p-side electrode (not shown) is made on the p-type GaN contact layer 107, and the n-side electrode (not shown) is made on the n-type GaN contact layer 103 in the partly removed region.

After that, the wafer-shaped sapphire substrate 101 having formed the laser structure is lapped from its bottom surface to adjust the thickness of the sapphire substrate 101 to approximately 150 $\mu$m. Then, in locations of the bottom surface of the sapphire substrate 101 for making cavity edges, which may be locations corresponding to (11–10)-oriented surfaces, straight cleavage-assist grooves 109 are made to extend in parallel to the (11–20)-oriented surfaces. Thus, in the direction parallel to the lengthwise direction of the mesa portion 108, that is, in the cavity direction, a plurality of cleavage-assist grooves 109 are made periodically in intervals approximately the same as the cavity length of the GaN semiconductor lasers to be finally made.

The sapphire substrate 101 is next cleaved into bars together with the semiconductor layers thereon along the cleavage-assist grooves 109 to make opposite cavity edges, and the bars are divided into chips. As a result, the intended GaN semiconductor laser is completed.

The conventional method for manufacturing a GaN semiconductor laser can make cavity edges of cleavable surfaces (quasi-cleavable surfaces) more excellent in optical characteristics than those of cavity edges made by etching semiconductor layers forming the laser structure.

However, the conventional method for manufacturing a GaN semiconductor laser involves the following problems.

In most semiconductor lasers, the optical cavity length is designed to 1 mm or less, more particularly, in the range of 0.2 to 0.7 mm, approximately. However, in order to minimize the optical cavity length to these values, the thickness of the sapphire substrate 101 must be reduced by lapping. For example, unless the thickness of the sapphire substrate 101 is 150 $\mu$m or less, the sapphire substrate 101 and overlying semiconductor layers do not readily divide along the cleavage-assist groove 109, and it was difficult to make cavity edges acceptable in optical evenness at the desired position.

Moreover, since the sapphire substrate 101 is chemically stable, it is difficult to selectively etch semiconductor layers made of nitride III–V compound semiconductors layers, or insulating films such as $SiO_2$ film and SiN film, which are made on the sapphire substrate. It is therefore difficult to chemically process the sapphire substrate 101 alone while protecting a part of the crystal growth surface and bottom surface. Therefore, in order to make cleavage-assist grooves 109 in the sapphire substrate 101, dicing, scribing or other mechanical processing was necessary, and there arose problems in pattern accuracy and micro processing of the cleavage-assist grooves 109.

Since the sapphire substrate 101 decreases in strength with a reduction in thickness, if the sapphire substrate 101 is made thinner, then the sapphire substrate 101 is apt to crack to its surface or break while the cleavage-assist grooves 109 are made on the bottom surface of the sapphire substrate 101 by using a dicer or scriber, for example. In this case also, it was impossible to make acceptable cavity edges. For the purpose of preventing cracks of breakage of the sapphire substrate 101, there arose the need for minimizing varieties in thickness of the sapphire substrate 101 by controlling the thickness of sapphire substrate 101 after lapping, and the thickness of the sapphire substrate 101 in locations of the cleavage-assist grooves 109 after being made. Furthermore, as the sapphire substrate 101 was made thinner and thinner, warp of the substrate became too large to handle the substrate due to thermal stress caused by a difference in thermal expansion coefficient between the sapphire substrate 101 and semiconductor layers grown thereon, and/or damages by lapping or the like.

OBJECTS AND SUMMARY OF THE INVENTION

It is therefore an object of the invention to provide a semiconductor device, its manufacturing method and a substrate used for manufacturing a semiconductor device, ensuring excellent cleavable surfaces to be made on semiconductor layers precisely and stably when edges of cleavable surfaces are made on semiconductor layers stacked on a substrate, even when the substrate is non-cleavable, difficult to cleave or different in cleanable orientation from the semiconductor layers, or the size of the semiconductor device is as small as 1 mm or less.

According to the first aspect of the invention, there is provided a semiconductor device having a cleavable semiconductor layer stacked on a substrate and having an edge made up of a cleavable surface, comprising:

the edge of the semiconductor layer being made by first stacking the semiconductor layer on the substrate, then making a cleavage-assist groove at least partly in the semiconductor layer along a portion for making the edge except a portion for a major part of the edge, and cleaving the semiconductor layer and the substrate from the cleavage-assist groove.

According to the second aspect of the invention, there is provided a semiconductor device including a cleavable semiconductor layer stacked on a substrate and having a pn junction and an edge made up of a cleavable surface, comprising:

the edge of the semiconductor layer being made by first stacking the semiconductor layer on the substrate, then making a cleavage-assisting groove at least in a portion of the semiconductor layer in a location for making the edge by a depth beyond the pn junction, and cleaving the semiconductor layer and the substrate from the cleavage-assist groove.

According to the third aspect of the invention, there is provided a device-manufacturing substrate for use in manufacturing a semiconductor device by stacking a cleavable semiconductor layer on the substrate and cleaving the substrate and the semiconductor layer to obtain a semiconductor device having an edge made up of a cleavable surface of the semiconductor layer, comprising:

a cleavage-assist groove made at least in a part of a location of the semiconductor layer for making the edge except a portion for a major part of the edge.

According to the fourth aspect of the invention, there is provided a device-manufacturing substrate for use in manufacturing a semiconductor device by stacking a cleavable semiconductor layer including a pn junction on the substrate and cleaving the substrate and the semiconductor layer to obtain a semiconductor device having an edge made up of a cleavable surface of the semiconductor layer, comprising:

a cleavage-assist groove made at least in a part of a location of the semiconductor layer for making the edge by a depth beyond the pn junction.

According to the fifth aspect of the invention, there is provided a method for manufacturing a semiconductor device including a cleavable semiconductor layer stacked on a substrate and having an edge made up of a cleavable surface, comprising:

a step of stacking the semiconductor layer on the substrate;

a step of making a cleavage-assist groove at least in a location of the semiconductor layer for making the edge except a portion for a major part of the edge; and a step of cleaving the semiconductor layer and the substrate from the cleavage-assist groove to make the edge on the semiconductor layer.

According to the sixth aspect of the invention, there is provided a method for manufacturing a semiconductor device having a cleavable semiconductor layer stacked on a substrate and having an edge made up of a cleavable surface, comprising:

a step of stacking the semiconductor layer on the substrate;

a step of making cleavage-assist groove at least in a location of the semiconductor layer for making the edge by a depth beyond the pn junction; and a step of cleaving the semiconductor layer and the substrate from the cleavage-assist groove to make the edge on the semiconductor layer.

In the present invention, the cross-sectional shape of the cleavage-assist groove may be rectangular. However, for facilitating regulation of the cleaving position and the process of cleaving the semiconductor layers and the substrate, the cleavage-assist groove is preferably configured to concentrate stress to its bottom upon cleavage, such as a V-shaped, U-shaped groove or any shape with one side surface parallel to the lengthwise direction being a vertical surface, in its cross section.

In the present invention, the portion as the main portion of the edge changes depending upon the sort of the semiconductor device. For example, in a semiconductor device where light enters and exits through edges of the semiconductor layers, namely, in a semiconductor light emitting device such as semiconductor laser or light emitting diode, or in an optical semiconductor device such as photo detector or other semiconductor optical detector device, the main portion of the edge is a portion behaving as the light outlet region or the light inlet region, and more preferably, it is a portion including its proximity. In an electron mobility device such as field effect transistor, or in a semiconductor integrated circuit incorporating a plurality of electron mobility devices, the main portion of the edge is a structurally central part of each chipped device, for example.

In the present invention, when the semiconductor device is an optical semiconductor device having a light outlet region or a light inlet region on its edge, the cleavage-assist groove is made in a location of the edge outside the location for the light outlet region or the light inlet region so that the characteristics of the optical semiconductor device are not damaged. In this case, in the first, third and fifth aspects of the invention, the cleavage-assist groove may be made directly above the location of the edge for the light outlet region or the light inlet region but not reaching the location for the light outlet region or the light inlet region.

In the present invention, usable materials of the semiconductor layers involve nitride III–V compound semiconductors containing, for example, at least one group III element selected from the group consisting of Ga, Al, In and B, and one or more group V elements including at least N and including As or P, where appropriate. Examples of nitride III–V compound semiconductors are GaN, AlGaN, GaInN, and AlGaInN. The substrate used in the invention may be any which is non-cleavable, difficult to cleave or different in cleavable orientation from the semiconductors stacked thereon. Examples of such substrates involve a sapphire substrate used in semiconductor devices such as semiconductor lasers using the above-mentioned nitride III–V compound semiconductors.

In the third, fourth, fifth and sixth aspects of the invention, the cleavage-assist groove preferably extends in parallel to the cleavable surface of the semiconductor layers, and cleavage-assist grooves are preferably made periodically in approximately equal intervals in the direction normal to the cleavable surfaces of the semiconductor layers.

According to the first, third and fifth aspects of the invention configured as mentioned above, since the cleavage-assist groove is made at least in a part of the location other than the location used as the main portion of the edge in the semiconductor layers in the location where the edge should be made, the position for cleavage in the semiconductor layers is easily determined, and the semiconductor layers and the substrate can be cleaved from the cleavage-assist groove. Therefore, the substrate and the semiconductor layers can be cleaved easily and reliably along the cleavage-assist groove. As a result, even when the substrate is non-cleavable, difficult to cleave or different in cleavable orientation from the semiconductor layers thereon, or the semiconductor device is desired as small as 1 mm or less, edges of cleavable surfaces can be made stably in the semiconductor layers while regulating the cleaving position in the semiconductor layers. Additionally, since the cleavage-assist grooves is made in a location other than the portion as the main portions of the edge, the cleavable surface can be made in the semiconductor layers without damaging the characteristics of the semiconductor device to be made.

According to the second, fourth and sixth aspects of the invention configured as explained above, since the cleavage-assist groove is made at least in a part of the semiconductor layers in a location for making the edge to a depth beyond the pn junction, the cleaving position in the semiconductor layers is easily determined, and the semiconductor layers and the substrate can be cleaved from the cleavage-assist groove. Therefore, the substrate and the semiconductor layers can be cleaved easily and reliably along the cleavage-assist groove. As a result, even when the substrate is non-cleavable, difficult to cleave or different in cleavable orientation from the semiconductor layers thereon, or the semiconductor device is desired as small as 1 mm or less, edges of cleavable surfaces can be made stably in the semiconductor layers while regulating the cleaving position in the semiconductor layers. Additionally, since the cleavage-assist groove is deeper in the semiconductor layers than that with a depth not reaching the pn junction, the substrate and the semiconductor layers can be cleaved more easily.

Furthermore, the present invention is configured to make the cleavage-assist groove in the semiconductor layers, the cleavage-assist groove can be made by dry etching in a wafer process. Therefore, the cleavage-assist groove can be made with a good pattern accuracy, and micro processing can be conducted to make the cleavage-assist groove in form of a broken line. Moreover, since the invention needs no mechanical processing such as dicing or scribing required in the conventional technique, cracking or breakage of the substrate does not occur upon making the cleavage-assist groove even when the substrate is thin and weak.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
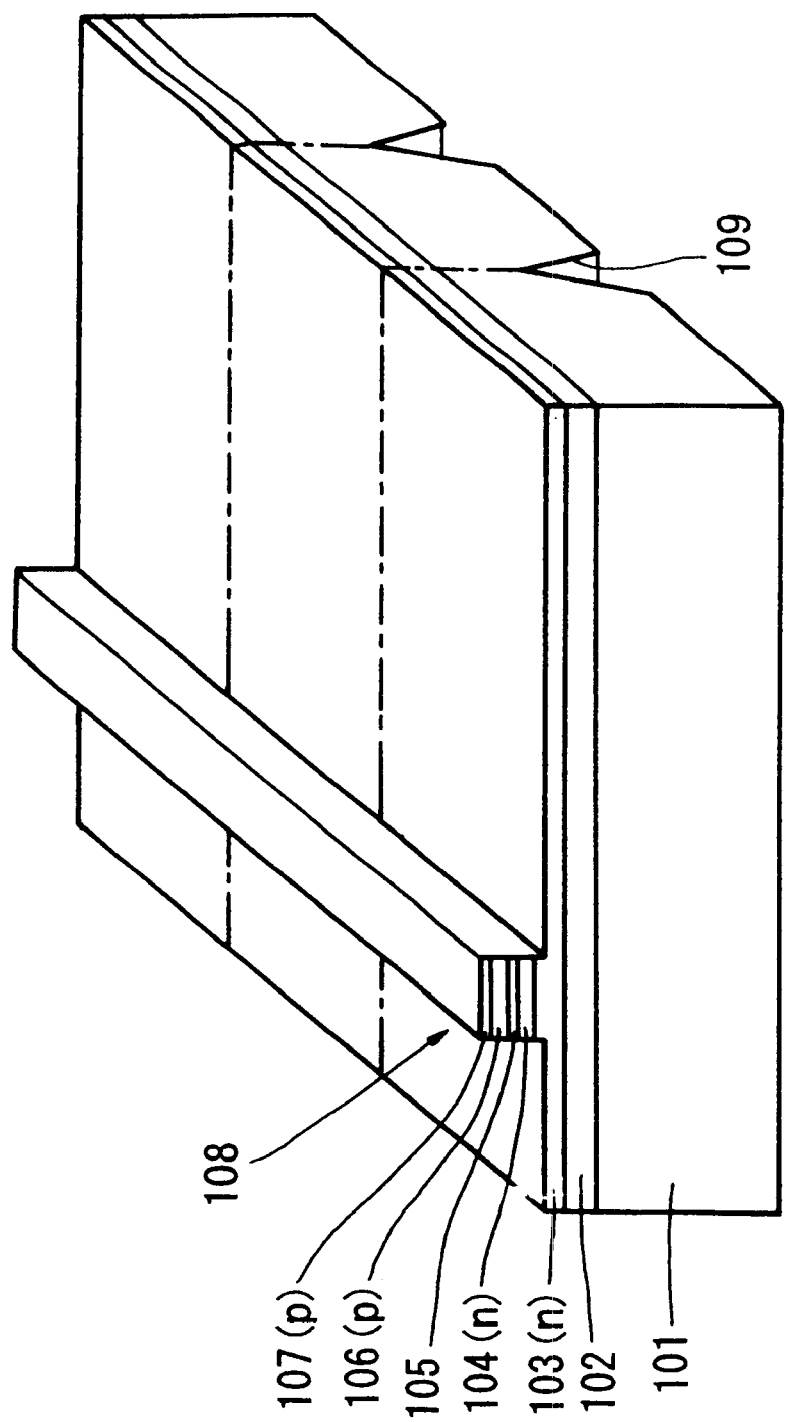
FIG. 1 is a perspective view for explaining a conventional method for manufacturing a GaN semiconductor laser.

Embodiments of the invention are explained below with reference to the drawings. In all of the drawings illustrating embodiments of the invention, the same or equivalent parts or elements are labeled with common reference numerals.

Figure 2:
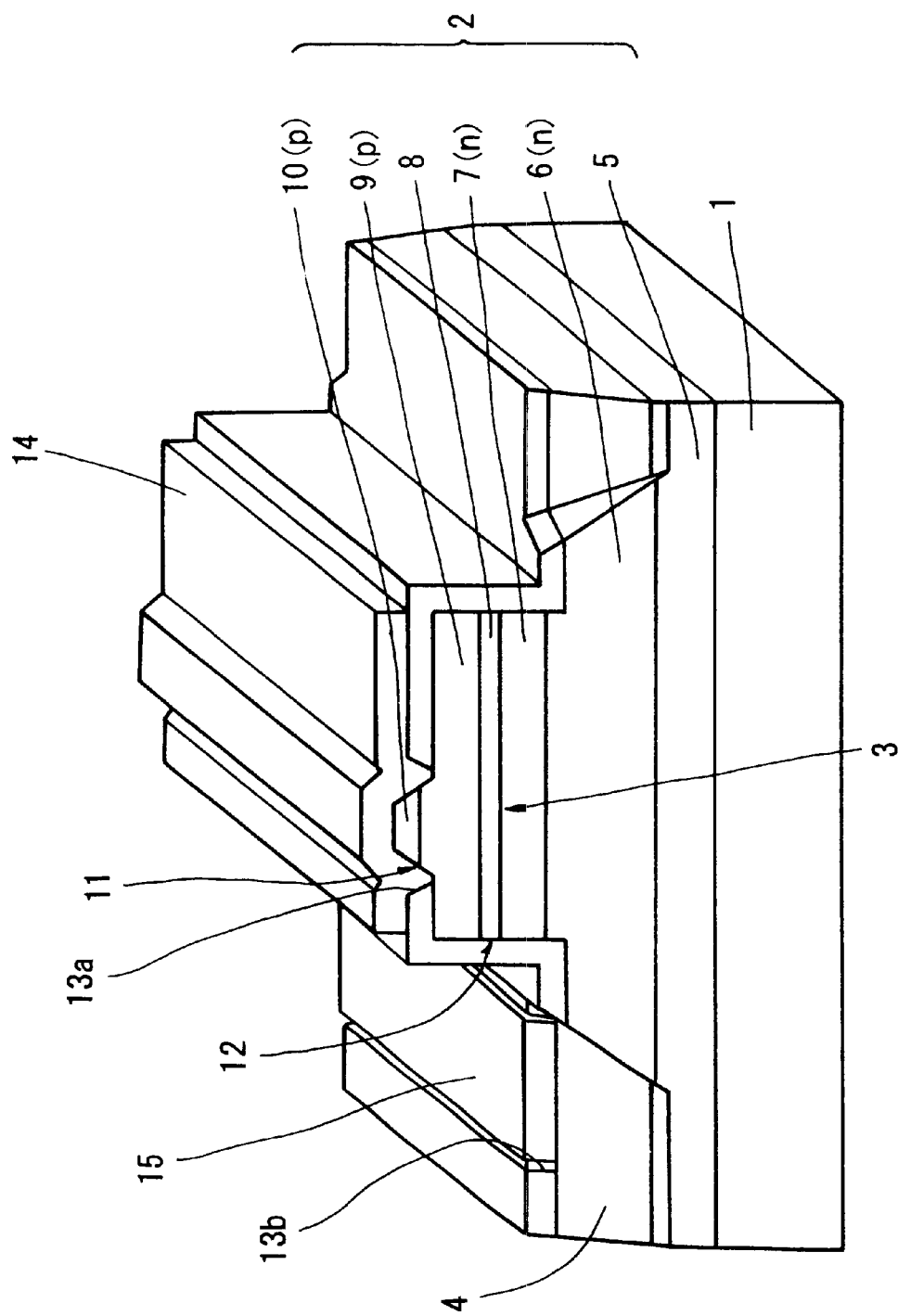
FIG. 2 is a perspective view of a GaN semiconductor laser according to the first embodiment of the invention.

FIG. 2 is a perspective view of a GaN semiconductor laser according to the first embodiment of the invention.

As shown in FIG. 2, the GaN semiconductor laser according to the first embodiment includes a semiconductor layer 2 including a plurality of semiconductor layers stacked on a c-plane sapphire substrate 1, for example, to form laser structure. The semiconductor layer 2 is made of nitride III–V compound semiconductors such as GaN, AlGaN, GaInN, and so on. The semiconductor layer 2 includes a pn junction. Cavity edges 3 of the semiconductor layer 2 (only the front-end cavity edge is illustrated in FIG. 2) are (11–20)-oriented surfaces which are cleaving surfaces of the nitride III–V compound semiconductors. In the GaN semiconductor laser, these cavity edges 3 are made by first stacking the semiconductor layer 2 on the sapphire substrate 1 in form of a wafer, then making cleavage-assist grooves 4 in predetermined portions of the semiconductor layer 2 and cleaving the semiconductor layer 2 and the sapphire substrate 1 from the cleavage-assist grooves 4.

Figure 3A:
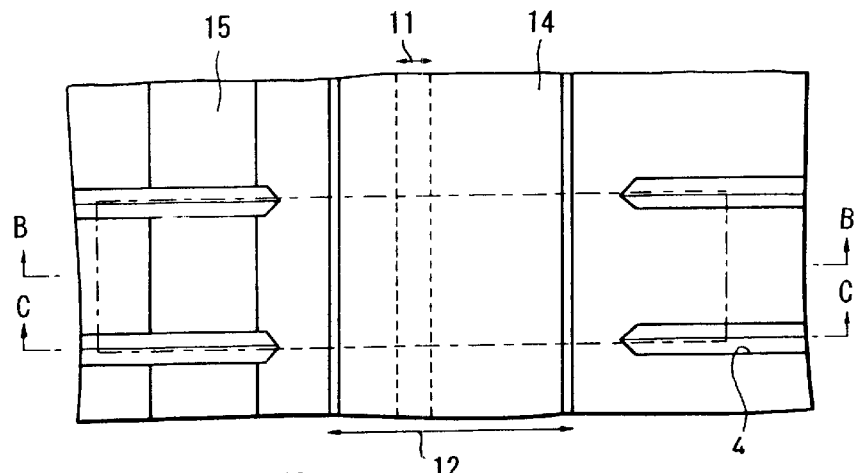
FIGS. 3A, 3B and 3C are plan view and cross-sectional views for explaining a method for manufacturing the GaN semiconductor laser according to the first embodiment of the invention.

Details of the GaN semiconductor laser according to the first embodiment are explained below together with its manufacturing method with reference to FIGS. 3A, 3B and 3C. FIG. 3A is a plan view of the wafer under a process of manufacture of the GaN semiconductor laser, FIG. 3B is a cross-sectional view taken along the B—B line of FIG. 3A, and FIG. 3C is a cross-sectional view taken along the C—C line of FIG. 3A.

Figure 3B:
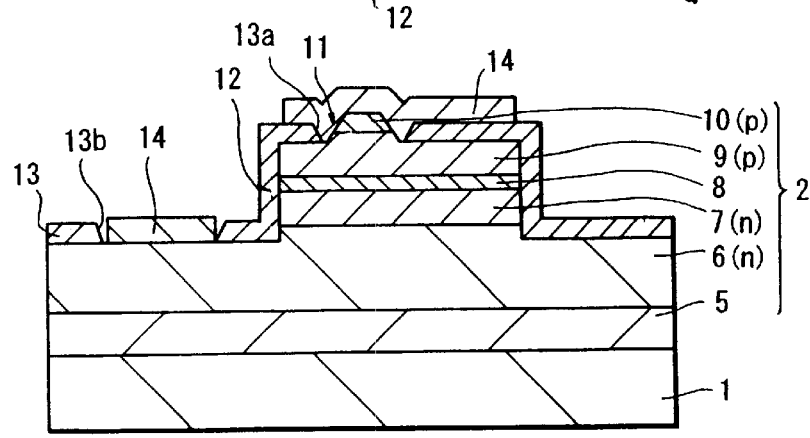
Figure 3C:
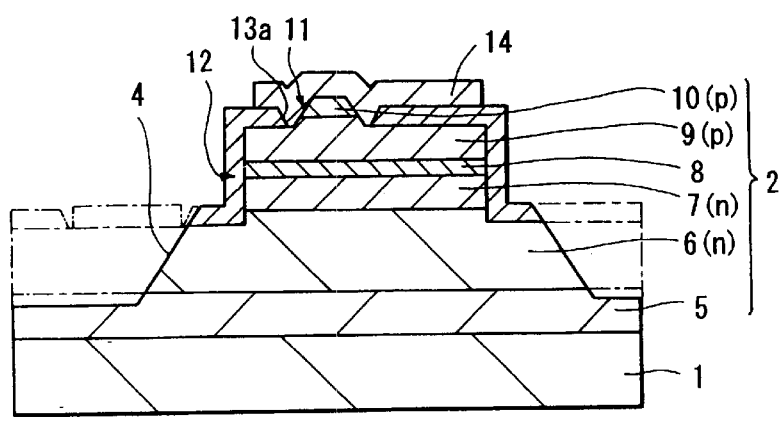

As shown in FIGS. 3A, 3B and 3C, in the manufacturing method of the GaN semiconductor laser, sequentially grown on the sapphire substrate 1 with a c-plane, for example, are a GaN buffer layer 5, n-type GaN contact layer 6, n-type AlGaN cladding layer 7, active layer 8 with a GaN/GaInN multi-quantum well structure, p-type AlGaN cladding layer 9 and p-type GaN contact layer 10 as the semiconductor layer 2 forming a laser structure by MOCVD. The GaN buffer layer 5 is 2 $\mu$m thick, for example, the n-type GaN contact layer 6 is 2 $\mu$m thick, for example, the n-type AlGaN cladding layer 8 is 0.5 $\mu$m thick, for example, the p-type AlGaN cladding layer 9 is 0.5 $\mu$m thick, for example, and the p-type GaN contact layer 10 is 0.2 $\mu$m thick, for example.

Next made on the p-type GaN contact layer 10 is a resist pattern (not shown) in form of a predetermined stripe. Using the resist pattern as a mask, wet etching is conducted to remove the semiconductor layer 2 to the depth reaching a halfway of the p-type AlGaN cladding layer 9 in its depth direction. As a result, an upper-lying portion of the p-type AlGaN cladding layer 9 and the p-type GaN contact layer 10 are patterned into a ridge stripe extending in one direction.

Then, the resist pattern used for the etching is removed, and another resist pattern (not shown) in form of a predetermined stripe extending in parallel to the lengthwise direction of the ridge stripe portion 11 is made on the p-type AlGaN cladding layer 9 and the p-type GaN contact layer 10. Using the resist pattern as a mask, the semiconductor layer 2 is selectively removed by RIE, for example, to the depth partly biting into the n-type GaN contact layer 6. As a result, an upper-lying part of the n-type GaN contact layer 6, n-type AlGaN cladding layer 7, active layer 8 and the lower-lying part of the p-type AlGaN cladding layer 9 are patterned into a predetermined mesa form extending in parallel to the lengthwise direction of the ridge stripe portion 11.

Taking the cleavability of the semiconductor layer 2 forming the laser structure into account, orientations of the ridge stripe portion 11 and the mesa portion 12 are previously determined so that the cavity edges 3 to be formed in the semiconductor layer 2 grown on the c-plane sapphire substrate 1 be (11–20)-oriented surfaces which are readily cleavable surfaces of the semiconductor layer 2.

After that, the resist pattern used for the etching is removed, and an insulation layer 13 such as SiO$_2$ film is formed on the entire surface by CVD, for example. Then, lithography and etching are conducted to make an opening 13a in the insulation layer 13 in the location above the ridge stripe portion 11 and an opening 13b in the insulation layer 13 in the location above the grooves. These openings 13a and 13b made in the insulation layer 13 are in the form of predetermined stripes extending in parallel to the lengthwise direction of the ridge stripe portion 11 and the mesa portion 12.

After that, the p-side electrode 14 of Ni/Ti/Au or Ni/Pt/Au, for example, is formed on the upper-lying part of the p-type AlGaN cladding layer 9 and the p-type GaN contact layer 10 in the location of the opening 13a formed in the insulation layer 13, and the n-side electrode 15 of Ti/Al/Pt/Au, for example, is made on the n-type GaN contact layer 6 in the location of the opening 13b formed in the insulation layer 13.

Figure 4:
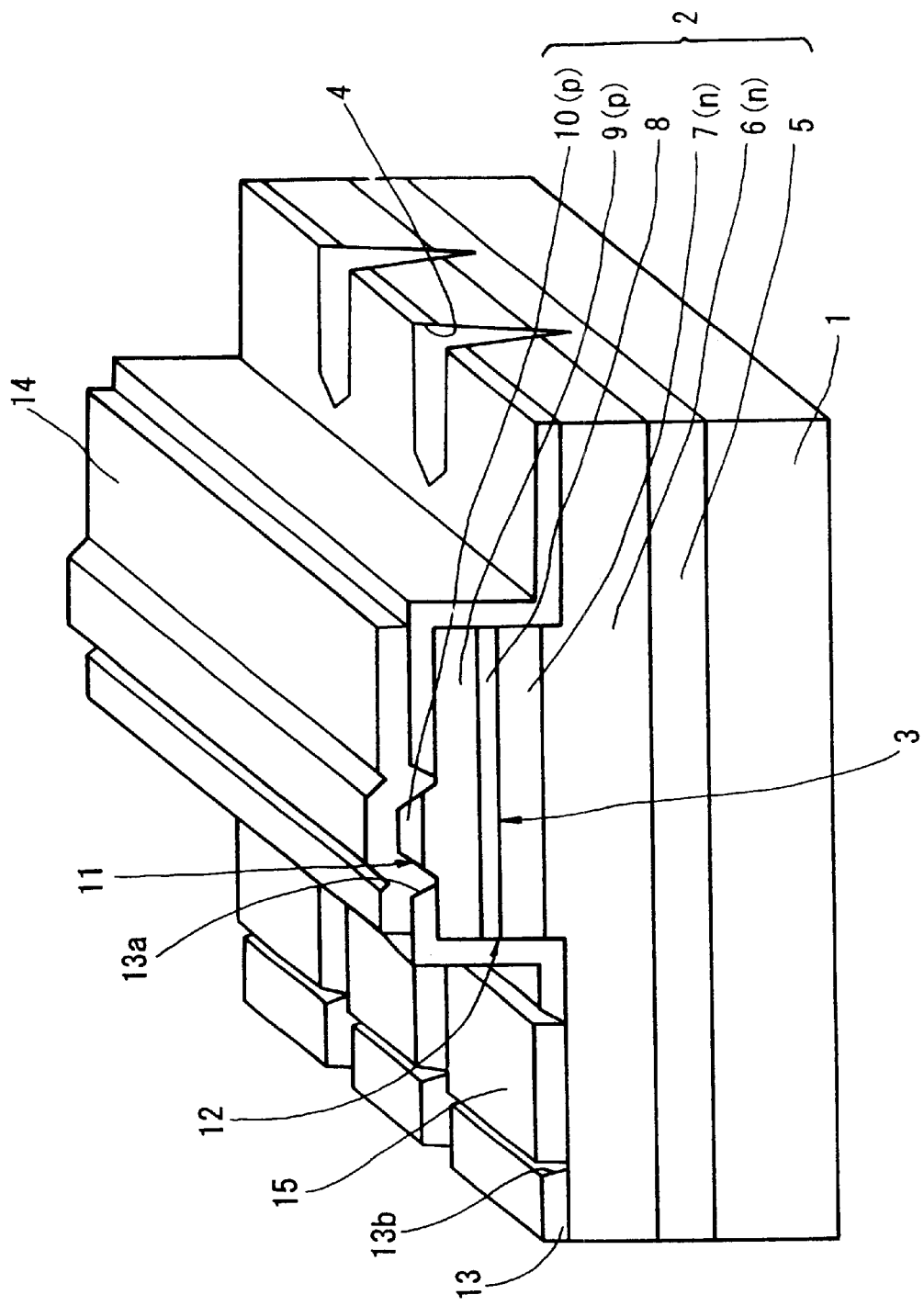
FIG. 4 is a perspective view for explaining the method for manufacturing the GaN semiconductor laser according to the first embodiment of the invention.

After the laser structure is made on the wafer-shaped sapphire substrate 1 in the above-explained manner, the semiconductor layer 2 is partly removed by dry etching such as ion milling, for example, in locations for making cavity edges 3 except portions where the ridge stripe portion 11 and the mesa portion 12 exist, namely, in locations for grooves at opposite sides of the mesa portion 12, to a depth partly biting into the GaN buffer layer 5, so as to make there cleavage-assist grooves 4 in form of predetermined stripes extending in parallel to the (11–20)-oriented surface of the semiconductor layer 2. That is, in the first embodiment, the cleavage-assist grooves 4 are made in the semiconductor layer 2 in locations for cavity edges 3 except portions of the ridge stripe portion 11 and the mesa portions 12 so as to sandwich the mesa portion 12 from opposite sides. In FIG. 3C, the portions removed by etching for making the cleavage-assist grooves 4 are shown by dot-and-dash lines. In this case, since the cleavage-assist grooves 4 are not formed in locations corresponding to light outlet regions and locations where pn junctions exist within the locations where cavity edges 3 are made later, the grooves do not adversely affect the characteristics of the GaN semiconductor laser. FIG. 4 is a perspective view of the wafer having formed the cleavage-assist grooves 4.

The cleavage-assist grooves 4 are configured as explained below to ensure easy and reliable cleavage of the semiconductor layer 2 and the sapphire substrate 1 along the cleavage-assist grooves 4 in a later process for cleavage.

Each cleavage-assist groove 4 is V-shaped, for example, in its cross section, so that stress applied during later cleavage concentrates to its bottom. Because of no etching anisotropy and small selectivity relative to the resist pattern used as the etching mask, ion milling mentioned above is advantageous for easily making such V-shaped cross-sectional cleavage-assist grooves 4 under appropriate conditions. The cleavage-assist groove 4 has a bottom extending straight in parallel with the (11–20)-oriented surface of the semiconductor layer 2. The lengthwise end of the cleavage-assist groove 4 is V-shaped, for example, in its plan view, so that it advantageously serve to determine the cleaving position of the semiconductor layer 2. From the viewpoint of improving the evenness of the cavity edges 3 to be made by later cleavage, the cleavage-assist grooves 4 for a common cavity edge 3, especially their bottoms and lengthwise ends, preferably lie on a common straight line.

In the first embodiment, since cavity edges 3 are made along the cleavage-assist grooves 4 as explained later, a plurality of cleavage-assist grooves 4 are made periodically with substantially the same distance as the cavity length of the GaN semiconductor laser to be finally made in the direction parallel to the lengthwise direction of the ridge stripe portion 11 and the mesa portion 12, that is, in the lengthwise direction of the cavity of the GaN semiconductor laser to be finally made.

After the cleavage-assist grooves 4 are made in predetermined locations of the semiconductor layer 2 in the above-explained manner, the sapphire substrate 1 is lapped from its bottom surface to adjust the thickness of the sapphire substrate 1 to approximately 50 through 150 $\mu$m, for example.

Figure 5:
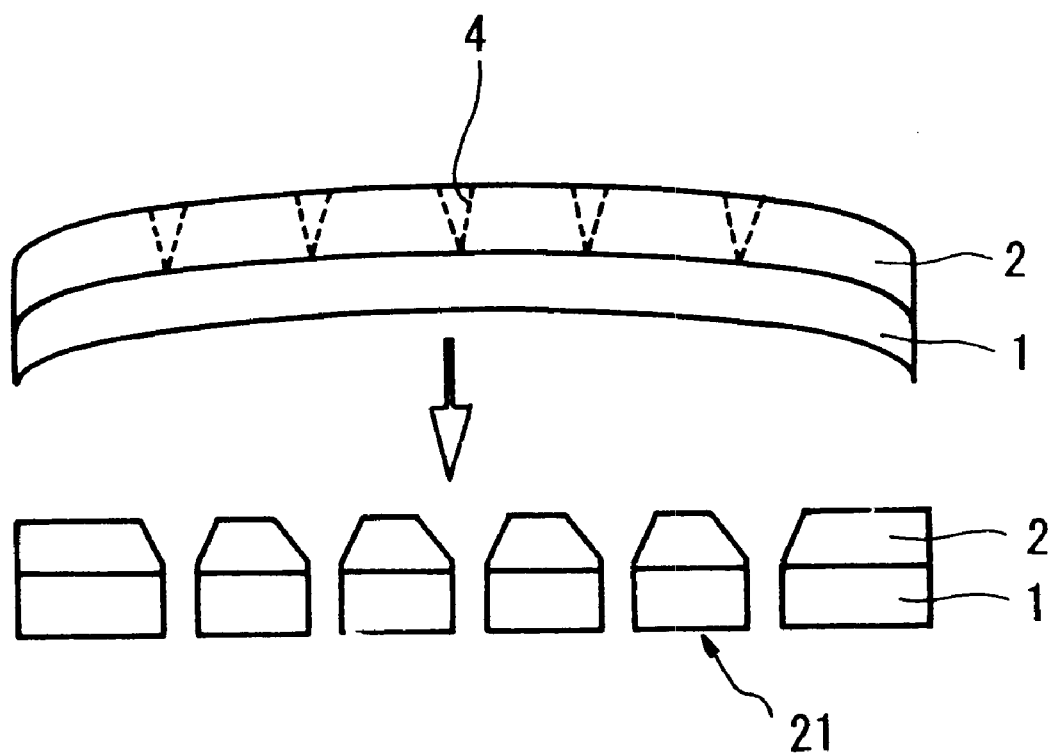
FIG. 5 is a cross-sectional view for explaining the method for manufacturing the GaN semiconductor laser according to the first embodiment of the invention.

After that, the wafer-shaped sapphire substrate 1 is cleaved together with the semiconductor layer 2 thereon along the cleavage-assist grooves 4 into bars to make opposite cavity edges 3 on the semiconductor layer 2. In this case, in the first embodiment shown here, cleavage of the sapphire substrate 1 and the semiconductor layer 2 is done in the following manner. FIG. 5 is a cross-sectional view for illustrating a way of cleaving the sapphire substrate 1 and the semiconductor layer 2 along the cleavage-assist grooves 4 in the first embodiment. FIG. 4 shows a cross-section along a direction crossing to FIGS. 2B and 2C.

As shown in FIG. 5, for cleaving the sapphire substrate 1 and the semiconductor layer 2 along the cleavage-assist grooves 4 in the first embodiment, the sapphire substrate 1 is bent by using a tool such as a circular roller (not shown), for example, so that the side of the cleavage-assist grooves 4, that is, the major surface having stacked the semiconductor layer 2, be convex, so as to concentrate the stress to bottoms of the cleavage-assist grooves 4 and to cleave the semiconductor layer 2 and the sapphire substrate 1 from the cleavage-assist grooves 4 into bars or chips 21.

Whichever direction the sapphire substrate 1 is bent, cleavage is possible. However, the sapphire substrate 1 is bent in the above-explained manner, namely, so that the major surface having formed the cleavage assist grooves 4 be convex because the semiconductor layer 2 and the sapphire substrate 1 are more readily divided in predetermined positions in this manner than cleaving them by bending the sapphire substrate 1 in the opposite direction.

After cleaving the sapphire substrate 1 and the semiconductor layer 2 into bars and making cavity edges 3 of cleaves surfaces in the semiconductor layer 2, edge coating is applied, where necessary, onto the cavity edges 3, and the bars are divided into chips. For chipping, the bars may be divided by dicing or scribing. Alternatively, cleavage-assist grooves may be previously made in predetermined positions of the semiconductor layer 2 to extend vertically of (11–20)-oriented surfaces of the semiconductor layer 2 which will become cavity edges 3, for example, and the bars may be cleaved along the cleavage-assist grooves.

In this manner, the intended GaN semiconductor laser is completed. In FIG. 3A, the portion bounded by dot-and-dash lines corresponds to a single laser chip of the GaN semiconductor laser to be finally made.

According to the first embodiment having the above-explained structure, the semiconductor layer 2 made of nitride III–V compound semiconductors to form the laser structure is staked on the sapphire substrate 1, then the cleavage-assist grooves 4 are made in predetermined portions of the semiconductor layer 2 where cavity edges 3 should be made, and the semiconductor layer 2 and the sapphire substrate 1 are cleaved from the cleavage-assist grooves 4. Therefore, positions for cleavage on the semiconductor layer 2 are readily determined, and the semiconductor layer 2 and the sapphire substrate 1 can be cleaved easily and reliably. As a result, even when the sapphire substrate 1 is non-cleavable, cavity edges 3 of cleavable surfaces with optically excellent evenness can be made stably in the semiconductor layer 2 stacked thereon. Moreover, even when a cavity length as small as 1 mm or less is desired, a GaN semiconductor laser having excellent cavity edges 3 with a desired cavity length can be realized.

Furthermore, according to the first embodiment, the cleavage-assist grooves 4 are formed only in limited parts of locations of the semiconductor layer 2 for making cavity edges 3, except the portion corresponding to the ridge stripe portion 11 for the light outlet region and the mesa portion 12 where the pn junction exists. Therefore, characteristics of the GaN semiconductor laser are not adversely affected in these portions however deep are the cleavage-assist grooves 4, and strict control is not required upon making the cleavage-assist grooves 4.

Moreover, according to the first embodiment, since the cleavage-assist grooves 4 are made in the semiconductor layer 2, and the sapphire substrate 1 is bent upon cleavage so that the major surface having formed the semiconductor layer 2 be convex, cleavage begins from the semiconductor layer 2 more advantageously for regulation of the cleaving position in the semiconductor layer 2 and for making excellent cleaved surfaces in the semiconductor layer 2, and it prevents problems possibly occurring when the sapphire substrate 1 is bent to concave the major surface having formed the semiconductor layer 2, namely, for example, the problem that the semiconductor layer 2, especially its outermost surface, is compressed, and it results in collapsing surface portions of the semiconductor layer 2 or deteriorating the evenness.

Further, according to the first embodiment, since the cleavage-assist grooves 4 can be made by a dry etching technique in the wafer process, such as ion milling, excellent pattern accuracy and dimensional accuracy of the cleavage-assist grooves 4 are ensured, and any micro processing can be conducted in accordance with the device structure, such as making the cleavage-assist grooves 4 in the pattern of broken lines in their plan views. Additionally, since dry etching can be used to make the cleavage-assist grooves 4, the embodiment needs no mechanical processing such as dicing or scribing, and prevents cracking of the wafer due to stress or damage by mechanical processing.

Figure 6A:
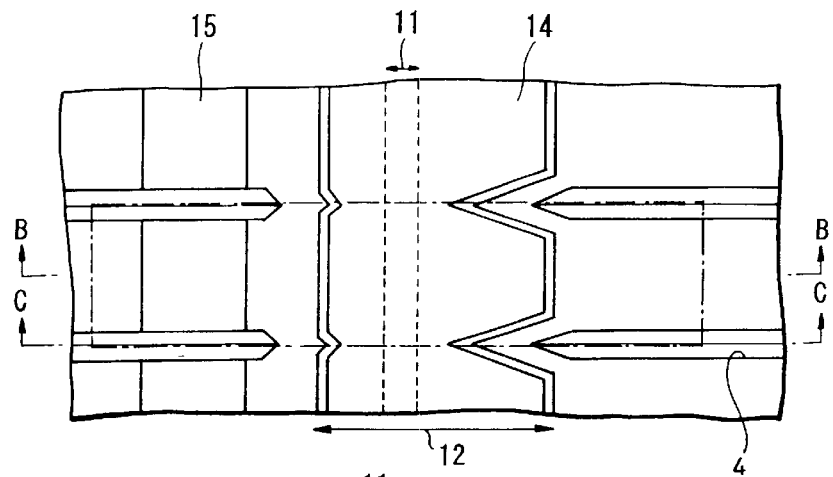
FIGS. 6A, 6B and 6C are plan view and cross-sectional views for explaining a method for manufacturing a GaN semiconductor laser according to the second embodiment of the invention.
Figure 6B:
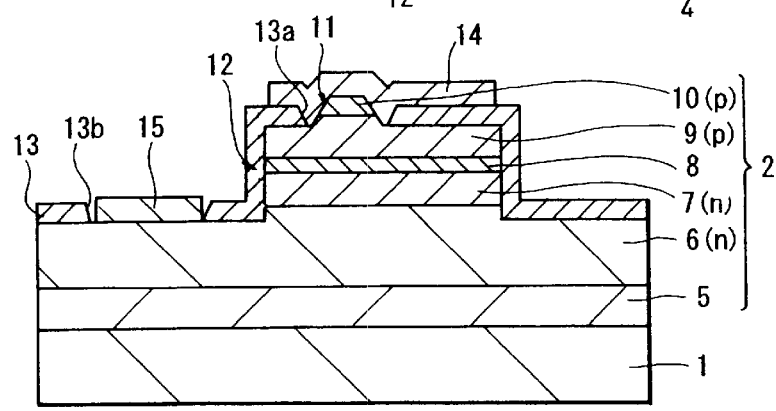
Figure 6C:
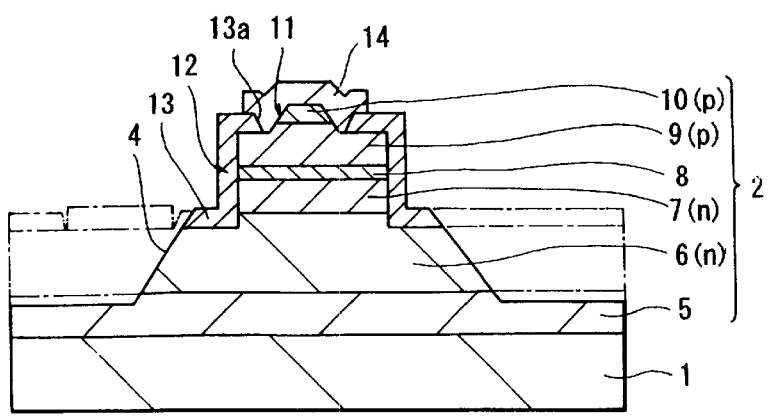

Next explained is the second embodiment of the invention. FIGS. 6A, 6B and 6C show a plan view and cross-sectional views for explaining a method for manufacturing a GaN semiconductor laser according to the second embodiment. FIG. 6A is a plan view of the wafer under a process of manufacture of the GaN semiconductor laser, FIG. 6B is a cross-sectional view taken along the B—B line of FIG. 6A, and FIG. 6C is a cross-sectional view taken along the C—C line of FIG. 6A.

As shown in FIGS. 6A, 6B and 6C, the process goes forth in the second embodiment in the same manner as the first embodiment, up to the step of patterning the upper part of the p-type AlGaN cladding layer 9 and the p-type GaN contact layer 10 into the form of a predetermined ridge stripe.

Next formed on the p-type AlGaN cladding layer 9 and the p-type GaN contact layer 10 is a resist pattern (not shown) in form of a predetermined stripe extending in parallel to the length wise direction of the ridge stripe portion 11 and having V-shaped constrictions at predetermined positions of the mesa portion 12 where cavity edges 3 should be made. Using the resist pattern as a mask, the semiconductor layer 2 is selectively removed by RIE to a depth partly biting into the n-type GaN contact layer 6 to make grooves. As a result, the upper part of the n-type GaN contact layer 6, n-type AlGaN cladding layer 7, active layer 8 and lower part of the p-type AlGaN cladding layer 9 are patterned into predetermined mesa configuration extending in parallel with the length wise direction of the ridge stripe portion 11. The mesa portion 12 has V-shaped constrictions from opposite sides at positions for making cavity edges 3 in its plan view. Note, however, the constrictions 12a of the mesa portion 12 do not extend to the ridge stripe portion 11.

The line connecting tips of mutually opposed constrictions 12a of the mesa portion 12 is preferably parallel to the (11–20)-oriented surface of the semiconductor layer 2 which will be made as cavity edges 3.

Next progressed is the same process as the first embodiment until the p-side electrode 14 and the n-side electrode 15 are made. Thereafter, in the same manner as the first embodiment, portions for grooves at opposite sides of the mesa portion 12 are partly removed by etching to a depth partly biting into the GaN buffer layer 5 to make there cleavage-assist grooves 4 extending in form of stripes in parallel to the (11–20)-oriented surface of the semiconductor layer 2. These portions removed by etching to make the cleavage-assist grooves q are shown in FIG. 6C by dot-and-dash lines. From the viewpoint of improving the evenness of the cavity edges 3 made by later cleavage, bottoms and tips of the cleavage-assist grooves 4 used for cleavage of a common cavity edge and tips of the constrictions 12a of the mesa portion 12 preferably lie along a common straight line.

After that, the process is progressed in the same manner as the first embodiment to complete the intended GaN semiconductor laser. In FIG. 6A, the portion bounded by dot-and-dash lines corresponds to a single laser chip of the GaN semiconductor laser to be finally made.

In the other respects, the second embodiment is the same as the first embodiment, and their explanation is omitted here.

According to the second embodiment, the same advantages as those of the first embodiment can be obtained. In the second embodiment, the cleavage-assist grooves 4 can be made to bring their tips closer to each other than the first embodiment at opposite sides of the mesa portion 12 so much as the mesa portion 12 is inwardly constricted at positions where the cavity edges 3 should be made. Therefore, the ratio of the extension of each cleavage-assist groove 4 relative to the entirety of the portion of the semiconductor layer 2 for making the cavity edge 3 can be increased as compared to the first embodiment to more facilitate cleavage of the semiconductor layer 2 and the sapphire substrate 1. Additionally, V-shaped constrictions along the portions for making cavity edges 3 also makes cleavage easier and makes regulation of the cleaving positions of the semiconductor layer 2 easier.

Figure 7A:
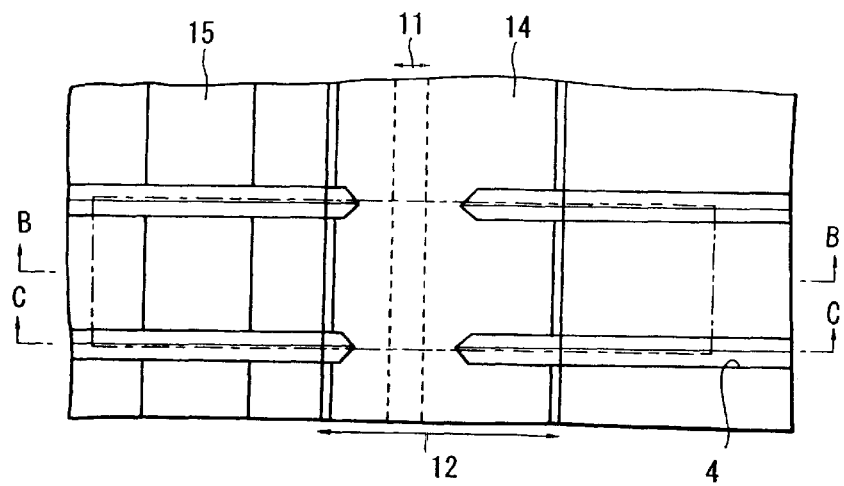
FIGS. 7A, 7B and 7C are plan view and cross-sectional views for explaining a method for manufacturing a GaN semiconductor laser according to the third embodiment of the invention.
Figure 7B:
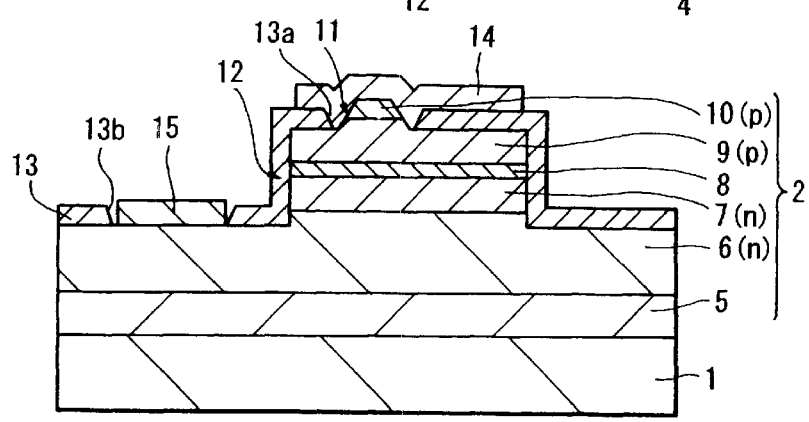
Figure 7C:
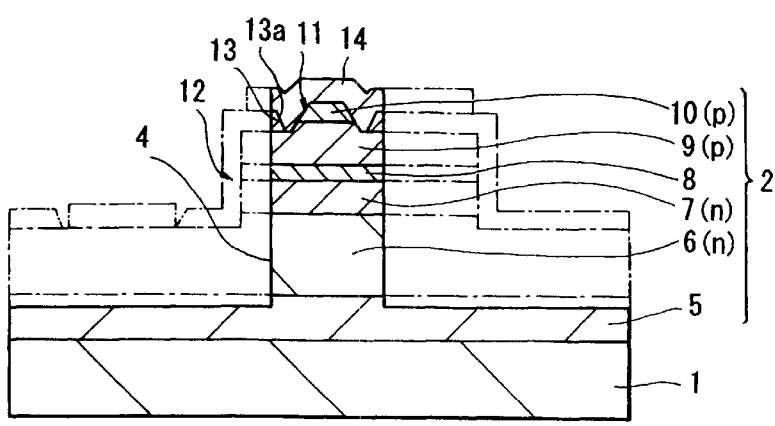

Next explained is the third embodiment of the invention. FIGS. 7A, 7B and 7C are plan view and cross-sectional views for illustrating a method for manufacturing a GaN semiconductor laser according to the third embodiment. FIG. 7A is a plan view of the wafer under a process of manufacture of the GaN semiconductor laser, FIG. 7B is a cross-sectional view taken along the B—B line of FIG. 7A, and FIG. 7C is a cross-sectional view taken along the C—C line of FIG. 7A.

As shown in FIGS. 7A, 7B and 7C, in the third embodiment, cleavage-assist grooves 4 are made in selective locations of the semiconductor layer 2 for making cavity edges 3 except the location corresponding to the ridge stripe portion 11, namely, on a part of the portion corresponding to the mesa portion 12 and on portions corresponding to grooves at opposite sides of the mesa portion 12 so as to sandwich the ridge stripe portion 11 from opposite sides.

That is, in the third embodiment, the process is progressed in the same manner as the first embodiment until the p-side electrode 14 and the n-side 15 are made. After that, the semiconductor layer 2 is selectively removed by etching in a part of the portion for making cavity edges 3 except the location other than the location corresponding to the ridge stripe portion 11, namely, in parts of the mesa portion 12 at opposite sides of the ridge stripe portion 11 and in portions corresponding to the grooves at opposite sides of the mesa portion 12, to a depth partly biting into the GaN buffer layer 5, for example, to make predetermined stripe-shaped cleavage-assist grooves 4 extending inn parallel to the (11–20)-oriented surface of the semiconductor layer 2. FIG. 7C illustrates these portions removed by etching for making the cleavage-assist grooves 4 by dot-and-dash lines. Although the cleavage-assist grooves 4 have a depth beyond the pn junction of the semiconductor layer 2, they are not made in the portion corresponding to the light outlet region, and do not damage characteristics of the GaN semiconductor laser.

After that, the process is progressed in the same manner as the first embodiment, the intended GaN semiconductor laser is completed. In FIG. 7A, the portion bounded by the dot-and-dash line corresponds to a single laser chip of the GaN semiconductor layer to be finally made.

According to the third embodiment, the same advantages as those of the first embodiment can be obtained. In the third embodiment, the cleavage-assist grooves 4 made in the semiconductor layer 2 in the location for making cavity edges 3 extends to partly bite into the mesa portion 12. Therefore, the cleavage-assist grooves 4 can be made to bring their tips at opposite sides of the ridge stripe portion 11 closer to each other than the first embodiment. As a result, the ratio of the length of each cleavage-assist groove 4 relative to the full length of the portion for making a cavity edge 3 in the semiconductor layer 2 can be increased as compared with the first embodiment to more facilitate cleavage of the semiconductor layer 2 and the sapphire substrate 1.

Figure 8A:
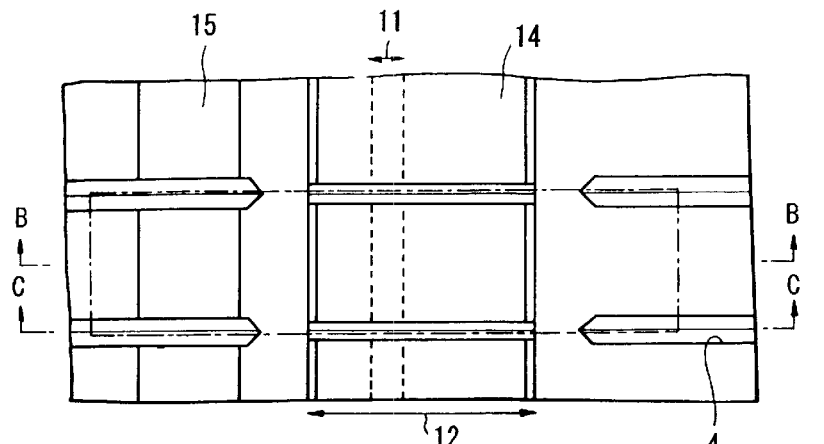
FIGS. 8A, 8B and 8C are plan view and cross-sectional views for explaining a method for manufacturing a GaN semiconductor laser according to the fourth embodiment of the invention.
Figure 8B:
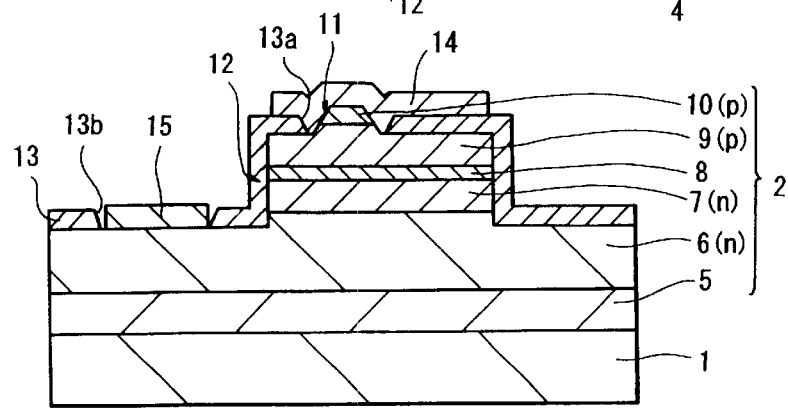
Figure 8C:
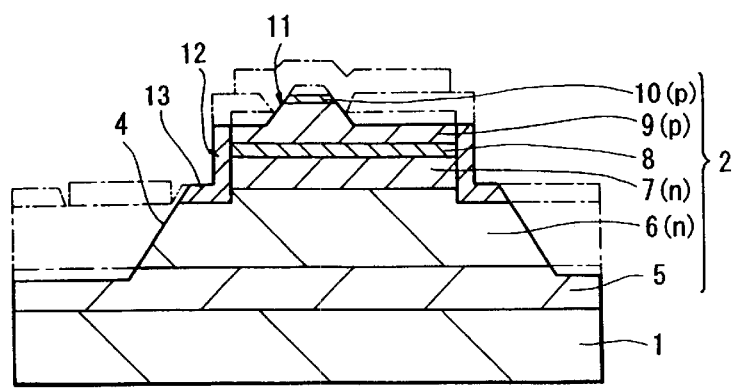

Next explained is the fourth embodiment of the invention. FIGS. 8A, 8B and 8C are plan view and cross-sectional views for explaining a method for manufacturing a GaN semiconductor laser according to the fourth embodiment. FIG. 8A is a plan view of a wafer under a process of manufacture of the GaN semiconductor laser, FIG. 8B is a cross-sectional view taken along the B—B line of FIG. 8A, and FIG. 8C is a cross-sectional view taken along the C—C line of FIG. 8A.

As shown in FIGS. 8A, 8B and 8C, in the fourth embodiment, cleavage-assist grooves 4 are made in the semiconductor layer 2 along the portion for making the cavity edges 3 not only in locations for grooves at opposite sides of the mesa portion 12 so as to sandwich the mesa portion 12 from opposite sides but also in the location of the ridge stripe portion 11 and the mesa portion 12.

That is, in the fourth embodiment, the process is progressed in the same manner as the first embodiment until the n-side electrode 14 and the p-side electrode 15 are made. Thereafter, in locations corresponding to grooves at opposite sides of the mesa portion 12 along the portion for making cavity edges 3, the semiconductor layer 2 is removed by etching to a depth partly biting into the GaN buffer layer 5 to make there cleavage-assist grooves 4 sandwiching the mesa portion 12 from opposite sides. Also, the semiconductor layer 2 is removed by etching to a depth partly biting into the p-type GaN contact layer 10 and to a depth partly biting into the p-type AlGaN cladding layer 9 in the other location of the mesa portion 12. Thus, the cleavage-assist grooves 4 are made also in locations of the ridge stripe portion 11 and the mesa portion 12. FIG. 8C shows these portions removed by etching by dot-and-dash lines.

The cleavage-assist grooves 4 made in locations of the ridge stripe portion 11 and the mesa portion 12 are preferably V-shaped, for example, in its cross section so as to concentrate the stress to their bottoms upon cleavage. The bottom of each cleavage-assist groove 4 made in the location of the ridge stripe portion 11 terminates at a half depth of the p-type GaN contact layer 10, and the bottom of each cleavage-assist groove 4 made in the other location of the mesa portion 12 terminates in a half depth of the p-type AlGaN cladding layer 9. That is, the depth of the cleavage-assist grooves 4 in the location of the ridge stripe portion 11 and the mesa portion 12 does not reach the light outlet region. Therefore, these grooves 4 do not adversely affect the characteristics of the GaN semiconductor laser. The cleavage-assist grooves in the location of the ridge stripe portion 11 and the mesa portion 12 may be made to extend in a part of the location, depending on the device structure.

After that, the process is progressed in the same manner as the first embodiment, and the intended GaN semiconductor laser is completed. In FIG. 8A, the portion bounded by the dot-and-dash line corresponds to a laser chip of the GaN semiconductor laser to be finally made.

In the other respects, the structure of the fourth embodiment is the same as the first embodiment and not explained here.

According to the fourth embodiment, the same advantages as those of the first embodiment are attained. In the fourth embodiment, since the cleavage-assist grooves extend also in the location of the ridge stripe portion 11 and the mesa portion 12, the ratio of the location with the cleavage-assist grooves 4 relative to the entire portion for making cavity edges 3 is larger than that in the first embodiment, and cleavage of the sapphire substrate 1 and the semiconductor layer 2 is easier.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

Although the first to fourth embodiment have been explained as configuring the cleavage-assist grooves v-shaped in their cross section. However, their cross-section may be U-shaped, any shape whose one side surface parallel to the lengthwise direction exhibits a vertical surface, or rectangular.

In the first to fourth embodiments, the cleavage-assist grooves 4 at opposite sides of the mesa portion 12 may be made by etching the semiconductor layer 2 to a depth partly biting into the n-type GaN contact layer 6, for example, or by etching it to a depth reaching the interface between GaN buffer layer 5 and the sapphire substrate 1. In the fourth embodiment, among the cleavage-assist grooves 4 in locations of the ridge stripe portion 11 and the mesa portion 12, those in location other than the ridge stripe portion 11 may be made by etching the semiconductor layer to a depth beyond the p-type AlGaN cladding layer 9.

Moreover, although the first to fourth embodiments employs MOCVD for growth of the semiconductor layer made of nitride III–V compound semiconductors, molecular epitaxy (MBE), for example may be used as well for growth of the semiconductor layer.

Furthermore, although the first to fourth embodiments have been explained as applying the invention to GaN semiconductor lasers having ridge stripe structures, the invention is applicable also to GaN semiconductor lasers having an electrode stripe structure.

Although the first to fourth embodiments have been explained as applying the invention to semiconductor lasers having DH structures (double heterostructures), the invention is applicable also to semiconductor lasers having SCH structures (separate confinement heterostructures), light emitting diodes, and also applicable to pnoto detectors or other semiconductor light detecting devices other than semiconductor light emitting devices such as semiconductor lasers and light emitting diodes.

Additionally, since the invention is a common technique usable for making cleaved surfaces in any semiconductor devices having cleavable semiconductor layers grown on substrates which are non-cleavable, difficult to cleave or different in cleavable orientation from the semiconductor layers thereon, the invention can be used not only for optical semiconductor devices such as semiconductor light emitting devices or semiconductor light detecting devices but also widely for all semiconductor devices including electron mobility devices such as field effect transistors, semiconductor integrated circuits incorporating a plurality of electron mobility devices and photo-electronic integrated circuits incorporating electron mobility devices and optical semiconductor devices on common substrates, and it is remarkably effective especially when used in semiconductor devices desired to have micro chip sizes. Further more, the invention is applicable also in semiconductor devices using various materials other than nitride III–V compound semiconductors.

Since the cleavage-assist groove is made at least in a part of the location other than the location used as the main portion of the edge in the semiconductor layers in the location where the edge should be made according to the first, third and fifth embodiments, and the cleavage-assist groove is made at least in a part of the semiconductor layers in a location for making the edge to a depth beyond the pn junction according to the second, fourth and sixth aspects of the invention, the position for cleavage in the semiconductor layers is easily determined, and the semiconductor layers and the substrate can be cleaved from the cleavage-assist groove. Therefore, the substrate and the semiconductor layers can be cleaved easily and reliably along the cleavage-assist groove. As a result, even when the substrate is non-cleavable, difficult to cleave or different in cleavable orientation from the semiconductor layers thereon, or the semiconductor device is desired as small as 1 mm or less, edges of cleavable surfaces can be made in the semiconductor layers under precise control while regulating the cleaving position in the semiconductor layers. As a result, the invention can realize a semiconductor laser having cleavable surfaces excellent in optical evenness and having cavity edges excellent in optical characteristics.

Additionally, according to the invention, since the cleavage-assist groove can be made by dry etching in a wafer process, the invention ensures excellent pattern accuracy and micro processing, as compared with conventional techniques relying on dicing, scribing or other mechanical processing for making the cleavage-assist groove, the cleavage-assist groove can be made with a good pattern accuracy, and prevents problems caused by mechanical damages such as cracking of wafers. Therefore, the invention ensures stable manufacturing of semiconductor devices.

What is claimed is:

1. A method for manufacturing a semiconductor device including a cleavable semiconductor layer stacked on a substrate and having an edge made up of a cleavable surface, comprising:

a step of stacking said semiconductor layer on said substrate;

a step of making a cleavage-assist groove at least in a location of said semiconductor layer for making said edge except a portion for a major part of said edge; and a step of cleaving said semiconductor layer and said substrate from said cleavage-assist groove to make said edge on said semiconductor layer.

2. The method for manufacturing a semiconductor device according to claim 1 wherein said cleavage-assist groove is made to sandwich said portion for the major part of said edge from opposite sides.

3. The method for manufacturing a semiconductor device according to claim 1 wherein said semiconductor layer includes a pn junction, and said cleavage-assist groove has a depth beyond said pn junction at least in a part thereof.

4. The method for manufacturing a semiconductor device according to claim 1 wherein said cleavage assist-groove has a depth terminating immediately above and not reaching said portion of the major part at least in a part thereof.

5. The method for manufacturing a semiconductor device according to claim 1 wherein said cleavage-assist groove extends in parallel with said cleavable surface of the semiconductor layer.

6. The method for manufacturing a semiconductor device according to claim 1 wherein a plurality of said cleavage-assist grooves are made periodically in substantially equal intervals in a direction normal to said cleavable surface of the semiconductor layer.

7. The method for manufacturing a semiconductor device according to claim 1 wherein said semiconductor layer is made of nitride III–V compound semiconductors.

8. The method for manufacturing a semiconductor device according to claim 1 wherein said substrate is non-cleavable, difficult to cleave or different in cleavable orientation from said semiconductor layer.

9. The method for manufacturing a semiconductor device according to claim 1 wherein said semiconductor device is an optical semiconductor device having a light outlet region or a light inlet region on said edge, and said cleavage-assist groove is made in a location except the location for the light outlet region or said light inlet region of said edge.

10. The method for manufacturing a semiconductor device according to claim 9 wherein said cleavage-assist groove is made to sandwich said portion for the light outlet region or the light inlet region of the edge from opposite sides.

11. The method for manufacturing a semiconductor device according to claim 9 wherein said semiconductor layer includes a pn junction, and said cleavage-assist groove has a depth beyond said pn junction at least in a part thereof.

12. The method for manufacturing a semiconductor device according to claim 9 wherein said cleavage-assist groove has a depth terminating immediately above and not reaching said portion for the light outlet region or the light inlet region of the edge at least in a part thereof.

13. The method for manufacturing a semiconductor device according to claim 9 wherein said semiconductor device is a semiconductor laser having said edge as its cavity edge.

14. The method for manufacturing a semiconductor device according to claim 13 wherein a plurality of said cleavage-assist groove are made periodically by substantially the same distance as the cavity length of said semiconductor laser to be made in a direction normal to said cleavable surface of said semiconductor layer.

15. The method for manufacturing a semiconductor device according to claim 1 wherein said cleavage-assist groove is made by dry etching.

16. A method for manufacturing a semiconductor device having a cleavable semiconductor layer stacked on a substrate and having an edge made up of a cleavable surface, comprising:

a step of stacking said semiconductor layer on said substrate;

a step of making cleavage-assist groove at least in a location of said semiconductor layer for making said edge by a depth beyond a pn junction in said semiconductor layer; and a step of a cleaving said semiconductor layer and said substrate from said cleavage-assist groove to make said edge on said semiconductor layer.

17. The method for manufacturing a semiconductor device according to claim 16 wherein said cleavage-assist groove is made in a location except a portion for a major part of said edge.

18. The method for manufacturing a semiconductor device according to claim 17 wherein said cleavage-assist groove is made to sandwich said portion for the major part of the edge from opposite sides.

19. The method for manufacturing a semiconductor device according to claim 16 wherein said cleavage-assist groove extends in parallel to said cleavable surface of the semiconductor layer.

20. The method for manufacturing a semiconductor device according to claim 16 wherein a plurality of said cleavage-assist grooves are made periodically in substantially equal intervals in a direction normal to said cleavable surface of the semiconductor layer.

21. The method for manufacturing a semiconductor device according to claim 16 wherein said semiconductor layer is made of nitride III–V compound semiconductors.

22. The method for manufacturing a semiconductor device according to claim 16 wherein said substrate is non-cleavable, difficult to cleave or different in cleavable orientation from said semiconductor layer.

23. The method for manufacturing a semiconductor device according to claim 16 wherein said semiconductor device is an optical semiconductor device having a light outlet region or a light inlet region on said edge, and said cleavage-assist groove is made in a location except the portion for said light outlet region or said light inlet region of the edge.

24. The method for manufacturing a semiconductor device according to claim 23 wherein said cleavage-assist groove is made to sandwich said portion for the light outlet region of the light inlet region of the edge from opposite sides.

25. The method for manufacturing a semiconductor device according to claim 23 wherein said semiconductor device is a semiconductor laser having said edge as its cavity edge.

26. The method for manufacturing a semiconductor device according to claim 25 wherein a plurality of said cleavage-assist grooves are made periodically by substantially the same distance as the cavity length of said semiconductor laser to be made.

27. The method for manufacturing a semiconductor device according to claim 16 wherein said cleavage-assist groove is made by dry etching.

* * * * *